(12) United States Patent
Jahromi et al.

(10) Patent No.: US 6,893,679 B2
(45) Date of Patent: May 17, 2005

(54) PROCESS FOR PREPARING A COMPOSITE MATERIAL BY VAPOR DEPOSITING A BARRIER LAYER ON A SUBSTRATE

(75) Inventors: Shahab Jahromi, Maastricht (NL); Olav M Aagaard, Geleen (NL); Jan M Houben, Oirsbeek (NL); Karel G. H. Raemaekers, Sittard (NL)

(73) Assignee: DSM N.V., Heerlen (NL)

( * ) Notice: Subject to any disclaimer, the term of this patent is extended or adjusted under 35 U.S.C. 154(b) by 27 days.

(21) Appl. No.: 10/341,403

(22) Filed: Jan. 14, 2003

(65) Prior Publication Data

US 2003/0108671 A1 Jun. 12, 2003

Related U.S. Application Data

(62) Division of application No. 09/723,328, filed on Nov. 28, 2000, now Pat. No. 6,632,519, which is a continuation of application No. PCT/NL99/00219, filed on Apr. 15, 1999.

(30) Foreign Application Priority Data

Jun. 15, 1998 (NL) .............................................. 1009405

(51) Int. Cl.$^7$ .............................................. C23C 16/00
(52) U.S. Cl. .................................. 427/248.1; 427/255.6
(58) Field of Search ............................ 427/248.1, 255.6

(56) References Cited

U.S. PATENT DOCUMENTS 3,627,599 A * 12/1971 Goldmacher et al. ....... 438/754
4,242,412 A    12/1980 Funaki et al.
4,619,735 A *  10/1986 Norton ........................ 162/135
5,281,630 A     1/1994 Salsman

FOREIGN PATENT DOCUMENTS

| DE | 2726667 A | * 12/1978 | ............ B05D/3/02 |
| DE | 3728331 A | *  3/1989 | ............ A62D/3/00 |
| GB | 495479    |   12/1938 |                       |
| GB | 946365    |    1/1964 |                       |
| JP | 9239938   |    9/1997 |                       |

OTHER PUBLICATIONS

S. Dieckhoff; Charitization of vapor phase deposited organic molecules on silicon surfaces; Fresenius' Journal of Analytical Chemistry; Jun. 24–27, 1996; pp. 258–262.

K. Suzuki; Deposition of triazine dithiol organic thin films on Fe substrate and their evaluation; Chemical Abstracts; Dec. 21, 1998; p. 1250.

English translation of Kawaguchi et al. (JP–51102072–A), Mar. 1975.

* cited by examiner

*Primary Examiner*—Timothy Meeks
(74) *Attorney, Agent, or Firm*—Mayer, Brown, Rowe, & Maw LLP

(57) ABSTRACT

The invention relates to a composite material and a process for manufacturing the composite material by applying at least a single organic barrier layer to a substrate to reduce the oxygen permeability of the substrate. Depending on the intended application, the composite material may also include an outer cover layer over the barrier layer to improve moisture resistance. The preferred materials are triazines, particularly melamine, that are vapor-deposited onto the substrate to form a thin, durable transparent barrier layer.

17 Claims, No Drawings

PROCESS FOR PREPARING A COMPOSITE MATERIAL BY VAPOR DEPOSITING A BARRIER LAYER ON A SUBSTRATE

This application is a divisional application of Ser. No. 09/723,328, filed Nov. 28, 2000 now U.S. Pat. No. 6,682,519, which is a continuation of PCT/NL99/00219, filed Apr. 15, 1999, which is based on Netherlands application 1009405, filed Jun. 15, 1998, all of which are hereby incorporated in their entirety by reference.

The invention relates to a composite material comprising a substrate and at least one layer applied to the substrate. The invention relates in particular to an composite material comprising a substrate and a layer having permeability barrier properties on the substrate. The invention also relates to a process for the manufacture of a composite material comprising a substrate and a barrier layer applied to the substrate using vapour deposition.

A composite material comprising a substrate and a layer on the substrate was disclosed in U.S. Pat. No. 3,442,686. This patent describes a composite film that includes an organic base sheet, a heat sealable top coating, and an intermediate barrier layer of an inorganic material. The disclosed barrier layer, preferably comprising an inorganic oxide or salt, is typically vapour deposited on the base sheet and then covered by an extruded top coating. The barrier layer, generally at least 0.02 $\mu$m thick, and more typically 0.06–0.6 $\mu$m thick, is provided to reduce the permeability of the composite film to gases and water vapour.

However, despite the use of "glassy state" inorganic materials, preferred over more crystalline materials, to form the layer, the disclosed inorganic barrier layers remain relatively brittle. This brittleness remained a drawback that allowed cracks to form in the barrier layer when the film was deformed. This cracking seriously degrades the barrier layer performance, allowing gases and water vapor to permeate the film. Another drawback associated with the disclosed inorganic layers are the high temperatures developed in the film during the vaccuum deposition process, usually above 100° C. These high temperatures seriously limit the use of the disclosed inorganic layers on temperature-sensitive substrates such as polymers with a low glass transition temperature. Moreover, further drawbacks associated with the disclosed films are their high cost, reduced optical clarity, and discoloration such as yellow (silicon oxide) or yellow-red (iron oxides).

The applicant has developed an improved composite material comprising a substrate and a triazine compound barrier layer that overcomes some of the deficiencies associated with inorganic barrier layers. In addition, the applicant has developed a process for manufacturing the improved composite material in which the triazine barrier layer may be vapour deposited on heat-sensitive substrate materials.

The composite material according to the invention was found to provide a surprisingly durable barrier to gases, in particular oxygen, using a barrier layer comprising a triazine compound. Surprisingly, it was also found that composite materials according the present invention exhibits excellent sealability and further provides good paintability, printability and scratch resistance.

The composition material according to the present invention, utilizing a triazine compound barrier layer rather than an inorganic barrier layer such as silicon oxide, also exhibits improved resistance to mechanical damage. This means that materials prepared according to the present invention are better able to maintain their barrier properties after being subjected to deformation and increasing their utility as packaging materials.

A further advantage is derived from the lower temperatures required for applying the triazine compound layer to the substrate material. These lower temperatures allow a triazine compound layer to be applied to temperature-sensitive materials such as polyethylene that would not tolerate the temperatures necessary for application of an inorganic barrier layer.

In addition, the production costs of composite materials with a triazine compound barrier layer are lower than those associated with the production of equivalent composite materials using an inorganic barrier layer. Moreover, it has been found that composite materials incorporating a triazine compound barrier layer, even at thickness of 1 $\mu$m and more, maintains satisfactory transparency.

Examples of triazine compounds that can be used according to the invention are 1,3,5-triazines such as melamine, ammeline, ammelide, cyanuric acid, 2-ureidomelamine, melam, melem, melon, melamine salts such as for instance melamine cyanurate, melamine phosphate, dimelamine pyrophosphate or melamine polyphosphate and functionalized melamines, such as for instance hexamethoxymethyl melamine or acrylate-functionalized melamine. However, the invention is not limited to these triazine compounds. The preferred triazine compounds are melamine, melam, melem, melon, or a combination thereof, melamine being particularly preferred. The temperature at which melamine or other triazine compounds can be vapour deposited is lower than 600° C., preferably lower than 400° C.

The invention can be applied with the layer comprising only one triazine compound, but it is also possible for the layer to comprise a combination of two or more triazine compounds. It is also possible for several distinct layers of one or more triazine compounds to be used, for example a melamine layer as well as a melam or melem layer, to form the barrier layer. The advantage of this procedure is that it allows the specific properties of the different triazine compounds to be combined.

According to the invention it is also possible for the barrier layer to contain compounds in addition the described triazine compounds. Preferably, a triazine compound, or a combination of triazine compounds, comprises the majority of the barrier layer in composite materials according to the invention. In particular, the barrier layer preferably contains at least 75 wt. %, and more preferably at least 90 wt. %, of the trizazine compound(s). In composite materials according to the invention, barrier layer thickness is preferably less than 50 $\mu$m, more preferably less than 10 $\mu$m, and most preferably less than 5 $\mu$m. The minimum barrier layer thickness, however, would provide a continuous monomolecular layer of the triazine, and more preferably, would have a thickness of at least 5 nm.

Suitable substrates for application of the triazine barrier layer according to the invention include, but are not limited to, polymers, glass, paper and preferably precoated paper, cardboard and preferably precoated cardboard, and metal. The type of substrate selected, as well as the shape and thickness of the substrate, will depend largely on the application intended for the final product and do not, therefore, act to limit the scope of the invention. Examples of polymers that may be utilized as a substrate include polyethylene, polypropylene, acrylonitrile-butadiene-styrene copolymer, polyethylene terephthalate, polyamide, polycarbonate, but the invention is not limited to these polymers either.

In particular, the applicant has developed a composite material comprising a substrate and a barrier layer, the barrier layer comprising a triazine compound. As used herein, a barrier layer refers to a layer that, when applied to a substrate, produces a composite material that exhibits greatly reduced gas permeability, particularly reduced oxygen permeability, when compared with an uncoated substrate.

The applicants have found that triazine compounds are particularly suitable for application to a wide variety of substrate materials to form a barrier layer. Further, it is preferred that all, or at least a portion, of the triazine compound used in the barrier layer has a crystalline structure. Without committing itself to any scientific theory, the applicant speculates that the preferred triazine compounds are able to form crystalline structures comprising a plurality of triazine ring interconnected by hydrogen bonds. The advantage of such a crystalline structure is reported by M. Salame; Journal of Plastic Films & Sheeting; vol. 2; October 1986.

The gas barrier performance of the composite material according to the present invention provides advantages for foodstuff packaging applications. In foodstuff packaging applications, the composite material according to the invention can be provided as a composite film. A variety of films, including for example polymers such as polyethylene, polypropylene, biaxially oriented polypropylene, polyethylene terephthalate, polybutylene terephthalate and polyamide, may be utilized as suitable substrates. The choice of substrate structure is not, however, limited to films but includes polymers or copolymers or polymer blends formed into plates, cartons, boxes, bottles, crates and other containers. Similarly, the range of suitable substrate compositions is not limited to polymers and copolymers, but includes paper and preferably precoated paper, cardboard and preferably precoated cardboard, and other common packaging materials.

If the composite material according to the invention is intended for use as foodstuff packaging, it is advantageous to apply at least one more layer over the triazine compound barrier layer. In this preferred embodiment, the composite material comprises a substrate, an intermediate barrier layer comprising a triazine compound formed on the substrate, and a cover layer formed over the barrier layer. Selection of an appropriate cover layer material produces a composite material with improved moisture resistance. Suitable cover layer materials include polyethylene, polypropylene, biaxially oriented polypropylene, polyethylene terephthalate and polybutylene terephthalate. It is important that there is sufficient adhesion between the triazine compound barrier layer and the cover layer to avoid delamination. To ensure sufficient adhesion, an adhesive or adhesive layer is preferred for attaching the cover layer to the barrier layer. The triazine compound itself may act as the adhesive, or is at least a major component of the adhesive. Multilayer structures built up of repeating layers of films and triazine compounds are also possible to produce composite materials that are moisture resistant and have low gas permeability.

The triazine compounds may be applied to a substrate according to the invention using known vapour deposition techniques and equipment. Vapour deposition of the triazine compound on the substrate may take place under elevated pressure or atmospheric pressure, but reduced pressures are preferred. Further, the process may take place in an inert atmosphere, such as a nitrogen atmosphere. For example, a vapour deposition process according to the invention can be conducted in a vacuum chamber having a pressure of less than 1000 Pa, preferably less than 100 Pa, and more preferably, less than 10 Pa. If an inert gas is present the inert gas, for instance nitrogen, refers to the gas or gases present in the deposition chamber other than the compound or compounds being vapour deposited.

In a typical vapour deposition process, the substrate and a supply of the triazine compound are placed in a vacuum chamber under an inert atmosphere. The pressure within the vacuum chamber is then reduced and the triazine compound is vapourized by heating. As the vapourized triazine compound contacts the substrate, which is maintained at a lower temperature, and solidifies to form a layer on the substrate. The temperature difference maintained between the vapourizing triazine compound and the substrate to promote deposition is preferably at least 100° C.

The temperature necessary to vapourize the triazine compound depends on both the type of triazine compound selected and the pressure at which the deposition is conducted. The rate at which the selected triazine compound is vapourized is temperature and pressure dependent, with higher temperatures and lower pressures providing increased vapourization. Through selection of appropriate temperature and pressure combinations, the vapourization rate, or sublimation rate, of the triazine compound can be adjusted to control the rate at which the barrier layer is formed on the substrate. The upper limit for the vapourization temperature will be that temperature at which the triazine compound will decompose.

The applicant has also found that the composite material according to the invention also exhibits improved scratch resistance as a result of the vapour deposited triazine layer. A further increase in scratch resistance can be achieved by crosslinking the vapour-deposited triazine compound. As used herein, crosslinking is understood to mean reacting the triazine compound another compound to form a three-dimensional network. One example of such a compound is formaldehyde.

The applicant has also found that the fracture properties of ceramic materials (glass) can be improved by depositing a layer of a triazine compound on the ceramic materials. Similarly, the applicant has found that the corrosion resistance of metals can be improved by depositing a layer of a triazine compound on a metal substrate. The triazine compound applied in this manner can eliminate the need for applying a zinc or chromium layer on susceptible metal surfaces to prevent corrosion.

The following specific examples are intended to further illustrate, rather than restrict in any way, the principles and practices of the present invention.

EXAMPLE 1

In a test apparatus, melamine was vapour-deposited onto a glass plate substrate to form a triazine layer. The test apparatus included a vacuum chamber, a melting crucible into which the melamine to was placed, and a thermocouple for monitoring the temperature in the melting crucible. The pressure in the vacuum chamber was reduced to between $5 \times 10^{-3}$ Pa and $1 \times 10^{-2}$ Pa and the melting crucible was heated to vapourize the melamine. The glass plate was positioned relative to the melting crucible in such a way that the vapourized melamine was deposited on the glass plate.

Three experiments were executed with varying vapour-deposition temperature and the vapour-deposition time. The layer thickness and colour of each vapour-deposited layer was then measured. In addition, the IR spectrum of the vapour-deposited layers was measured using an IR spectrometer, specifically a Perkin Elmer® 1760X. The IR spectra thus obtained were compared with the IR spectrum of non-vapour-deposited melamine.

The results of the thickness measurements and colour determinations are presented in Table 1, Vapour-deposition conditions.

From the comparison of the IR spectra of the vapour-deposited melamine layers and the IR spectrum of the non-vapour-deposited melamine it was concluded that the vapour-deposition process does not alter the chemical structure of the melamine.

TABLE 1

Vapour-deposition conditions

| experiment | temperature (° C.) | time (s) | layer thickness (nm) | colour |
|---|---|---|---|---|
| 1 | 219 | 20 | 70 | transparent |
| 2 | 230 | 20 | 121 | transparent |
| 3 | 270 | 420 | 4300 | white |

EXAMPLE 2

Several experiments were carried out in which a melamine layer was vapour-deposited on a 12 μm thick polyethylene terephthalate (PET) film using the same test apparatus described in example 1 and varying the thickness of the vapour-deposited melamine layer being formed.

The oxygen permeability of the composite materials obtained and of the uncoated PET substrate was then measured in duplicate according to standard DIN 53 380, part 3, and the results compared. The results of these measurements are presented in Table 2.

Table 2 shows that the oxygen permeability of a PET substrate with a vapour-deposited melamine layer is reduced by a factor of 50 to 100 compared with the uncoated PET substrate. Table 2 also shows that although a vapour-deposited melamine layer only a few tens of nanometers thick produces significant reductions in the oxygen permeability, the vapour deposition of additional melamine does not produce any significant reduction in the oxygen permeability.

TABLE 2

Oxygen permeability of a PET substrate with a melamine layer vapour-deposited onto it as a function of the thickness of the vapour-deposited melamine layer

| Thickness of vapour-deposited melamine layer (nm) | oxygen permeability ($cm^3/m^2$ day bar) | |
|---|---|---|
| no layer vapour-deposited | 110 | 110 |
| 36 | 1.4 | 2.5 |
| 1080 | 1.0 | 2.4 |
| 2100 | 1.1 | 1.2 |

The degree of adhesion between the vapour deposited melamine layer and the polymer film was tested by applying a band of adhesive tape to the melamine layer and then quickly tearing off the adhesive tape. From this test it was concluded that the melamine did not come loose from the polymer film.

EXAMPLE 3

Using the same test apparatus described in Example 1, additional experiments were conducted in which melamine layers of various thickness were vapour-deposited onto a biaxially oriented polypropylene (BOPP) substrates.

The oxygen permeability of the composite products obtained and the uncoated BOPP substrate was measured in duplicate according to standard DIN 53 380, part 3, and the results compared. The results of these measurements are presented in Table 3.

Table 3 shows that the oxygen permeability of a BOPP substrate having a vapour-deposited melamine layer is reduced by a factor of 40 to 68 when compared with the uncoated BOPP substrate. Table 3 also shows that although a vapour-deposited melamine layer only a few tens of nanometers thick produces significant reductions in the oxygen permeability, the vapour deposition of additional melamine does not produce any significant reduction in the oxygen permeability.

TABLE 3

Oxygen permeability of a BOPP substrate with a melamine layer vapour-deposited onto it as a function of the thickness of the vapour-deposited melamine layer

| thickness of vapour-deposited melamine layer (nm) | oxygen permeability ($cm^3/m^2$ day bar) | |
|---|---|---|
| no layer vapour-deposited | 1600 | 1600 |
| 38 | 23.5 | 38.7 |
| 2100 | 32.5 | 39.7 |

The degree of adhesion between the vapour deposited melamine layer and the polymer film was tested by applying a band of adhesive tape to the melamine layer and then quickly tearing off the adhesive tape. From this test it was concluded that the melamine did not come loose from the polymer film.

What is claimed is:

1. A process for the manufacture of a composite material comprising a substrate and a layer comprising a triazine on the substrate, said process comprising vapor-depositing under reduced pressure at least one triazine compound selected from melamine, ammeline, ammelide, 2-ureidomelamine, melam, melem, melon, and melamine salts, on the substrate.

2. Process according to claim 1, wherein the vapor-deposited layer comprises a triazine compound selected from melamine, melam, melem, melon and combinations thereof.

3. Process according to claim 1, wherein the triazine compound includes at least melamine.

4. Process according to claim 1, wherein the process further comprises depositing another layer on top of the layer comprising the triazine compound.

5. Process according to claim 4, wherein the said another layer comprises a layer of polyethylene, polypropylene, polyethylene terephthalate or polybutylene terephthalate.

6. Process of claim 1, wherein said layer has a thickness of between 50 μm and $5 \times 10^{-3}$ μm.

7. Process according to claim 1, wherein the substrate is a polymer material.

8. Process according to claim 7, wherein the substrate is precoated paper or cardboard.

9. Process according to claim 7, wherein the substrate is ceramic material.

10. Process according to claim 1, wherein the layer comprises a triazine compound having a crystalline structure.

11. Process according to claim 10, wherein the substrate is a polymer material.

12. Process according to claim 10, wherein the substrate is precoated paper or cardboard.

13. Process according to claim 10, wherein the substrate is ceramic material.

14. Process according to claim 1, which comprises vapor depositing at least two layers, each layer comprising at least one triazine compound selected from melamine, ammeline, ammelide, 2-ureidomelamine, melam, melem, melon, melamine salts or mixtures thereof, on the substrate.

15. Process according to claim 14, wherein said at least two layers have a thickness of from 5 nanometers to 50 microns.

16. Process according to claim 1, wherein said vapor-deposited layer comprises at least 75 weight percent of triazine compound selected from melamine, ammeline, ammelide, 2-ureidomelamine, melam, melem, melon, melamine salts or mixtures thereof.

17. Process according to claim 16, wherein said vapor-deposited layer comprises at least 75 weight percent of melamine.

\* \* \* \* \*